United States Patent [19]
Chang

[11] Patent Number: 6,057,590
[45] Date of Patent: May 2, 2000

[54] STRUCTURE OF POLYSILICON LOAD FOR STATIC RANDOM ACCESS MEMORY

[75] Inventor: Ming-Lun Chang, Hsinchu, Taiwan

[73] Assignee: Winbond Electronics Corp., Hsinchu, Taiwan

[21] Appl. No.: 09/217,611

[22] Filed: Dec. 22, 1998

Related U.S. Application Data

[62] Division of application No. 08/959,066, Oct. 28, 1997.

[30] Foreign Application Priority Data

Aug. 23, 1997 [TW] Taiwan ................. 86112122

[51] Int. Cl.$^7$ ................................................. H01L 29/76
[52] U.S. Cl. .................... 257/536; 257/379; 257/380; 257/381; 257/536; 257/538; 257/367
[58] Field of Search .................. 257/536, 538, 257/380, 381, 379

[56] References Cited

U.S. PATENT DOCUMENTS

| | | | |
|---|---|---|---|
| 4,416,049 | 11/1983 | McElroy | 29/571 |
| 4,933,739 | 1/1990 | Harari | 357/55 |
| 5,400,277 | 3/1995 | Nowak | 365/154 |
| 5,602,408 | 2/1997 | Watanabe et al. | 257/350 |
| 5,710,461 | 1/1998 | Nguyen et al. | 257/754 |
| 5,744,846 | 4/1998 | Batra et al. | 257/380 |
| 5,751,630 | 5/1998 | Roberts | 365/154 |
| 5,847,412 | 12/1998 | Kakumu et al. | 257/66 |
| 5,872,381 | 2/1999 | Kato et al. | 257/380 |
| 5,883,417 | 3/1999 | Jao et al. | 257/377 |
| 5,907,176 | 5/1999 | Roberts | 257/379 |

FOREIGN PATENT DOCUMENTS

| | | | |
|---|---|---|---|
| 000576001 | 12/1993 | European Pat. Off. | 257/536 |
| 360250662 | 12/1985 | Japan | 257/536 |
| 363207165 | 8/1988 | Japan | 257/536 |

*Primary Examiner*—David Hardy
*Assistant Examiner*—Edgardo Ortiz
*Attorney, Agent, or Firm*—Finnegan, Henderson, Farabow, Garrett & Dunner, L.L.P.

[57] ABSTRACT

A polysilicon load structure and its manufacturing method for static random access memory, comprising the steps of first providing a semiconductor substrate, and then forming a first insulating layer over the substrate. Next, a trench is etched out from the insulating layer forming a step structure. Thereafter, a polysilicon layer is formed over the first insulating layer, and then a global ion implantation operation is performed. Next, a photoresist layer is formed over the polysilicon layer, and then a connector pattern is defined using a microlithographic process. Thereafter, the polysilicon layer is anisotropically etched to form a spacer on the sidewall of the trench. Subsequently, a second ion implantation is performed to adjust the resistance of the connector. Finally, microlithographic and etching processes are used to remove the unwanted portions of the polysilicon spacer and exposing the polysilicon spacer structure and the polysilicon connector structure.

11 Claims, 4 Drawing Sheets

STRUCTURE OF POLYSILICON LOAD FOR STATIC RANDOM ACCESS MEMORY

This is a division of application Ser. No. 08/959,066 filed Oct. 28, 1997, which is incorporated herein by reference.

BACKGROUND OF THE INVENTION

1. Field of Invention

The present invention relates to a structure and manufacturing method of a polysilicon load for static random access memory (SRAM). More particularly, the present invention relates to the structure and manufacturing method of a polysilicon load having a high resistance that can be used in a four-transistor SRAM (4T SRAM). In addition, some of the restrictions for miniaturizing memory cells using a conventional method can be eliminated.

2. Description of Related Art

FIG. 1 is a circuit layout diagram of a conventional four-transistor static random access memory (4T SRAM). As shown in FIG. 1, $R_1$ and $R_2$ are load resistors, and $M_1$ and $M_2$ are enhancement mode NMOS transistors that function as drivers. Furthermore, there are enhancement mode NMOS transistors $M_3$ and $M_4$ that are used for accessing data contained in the SRAM. The gates of transistors $M_3$ and $M_4$ are controlled by a horizontal conducting line known as a word line (WL). The drain terminals of $M_3$ and $M_4$ are connected to transistor drivers $M_1$ and $M_2$, respectively. Therefore, the ON and OFF state of the transistors $M_1$ and $M_2$ are closely related to the switching states of transistors $M_3$ and $M_4$. The source terminals of $M_3$ and $M_4$ are each connected to a vertical conducting line known as a bit line (BL).

In general, a high resistance polysilicon line is used as a load resistor in a four-transistor SRAM (4T SRAM). FIG. 2 is a top view of a conventional polysilicon line structure. A conventional polysilicon line is formed by first depositing a polysilicon film, and then adjusting the line resistance through an impurity implant. Subsequently, microlithographic and etching processes are used to obtain the necessary polysilicon line pattern 20 (including 20a and 20b). Thereafter, portions of line 20a and region within the line boundary 22 is implanted a second time using heavily concentrated impurities. The twice-implanted region becomes a connector 22a region and that the second implant is for lowering the resistance of the polysilicon line 20a. The remainder portions of the polysilicon line 20 now serves as a polysilicon load 20b. Therefore, resistance of polysilicon load 20b is largely determined by factors such as the quantity of implanted impurities during the first implant, thickness of the polysilicon film, the width W and the length L of the polysilicon load line 20b.

Conventionally, a high polysilicon load resistance can be obtained by methods such as lowering the thickness of polysilicon film, increasing the length of polysilicon load, or reducing the width of the polysilicon load. However, as SRAM cells are miniaturized further, a load having a sufficiently high resistance becomes harder to make using the conventional method described above. The main reason is that during subsequent thermal processing operations, highly concentrated impurities of the second implant within the connector will out-diffuse into the polysilicon load and resulting in a reduction in the final effective length of the polysilicon load. This presents a difficult problem for the conventional method when SRAM cells are further miniaturized in the future. Since the linear dimension of a polysilicon load is incapable of any more extension, and furthermore, reduction of polysilicon line width is still limited by the known processing techniques, therefore, the conventional method of forming a polysilicon load is a major drawback for future dimensional reduction of memory cells.

In light of the foregoing, there is a need in the art to provide an improved structure and manufacturing method for forming a polysilicon load.

SUMMARY OF THE INVENTION

Accordingly, the present invention is directed to provide a high resistance polysilicon load structure and its manufacturing method for static random access memory that can minimize the drawbacks and difficulties of miniaturizing a memory cell in a conventional method.

To achieve these and other advantages and in accordance with the purpose of the invention, as embodied and broadly described herein, the invention provides a static random access memory polysilicon load structure and its manufacturing method. The method comprises the steps of first providing a semiconductor substrate, and then forming a first insulating layer over the substrate. Next, a trench is etched out from the insulating layer forming a step structure. Thereafter, a polysilicon layer is formed over the first insulating layer, and then a global ion implantation operation is performed. Next, a photoresist layer is formed over the polysilicon layer, and then a connector pattern is defined on the photoresist layer using a lithographic process. Thereafter, the polysilicon layer is anisotropically etched to form a spacer along the sidewall of the trench. Subsequently, the connector is implanted secondly to adjust resistance. Finally, lithographic and etching processes are used to remove the unwanted portions of the polysilicon spacer and exposing the polysilicon spacer structure and the polysilicon connector structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
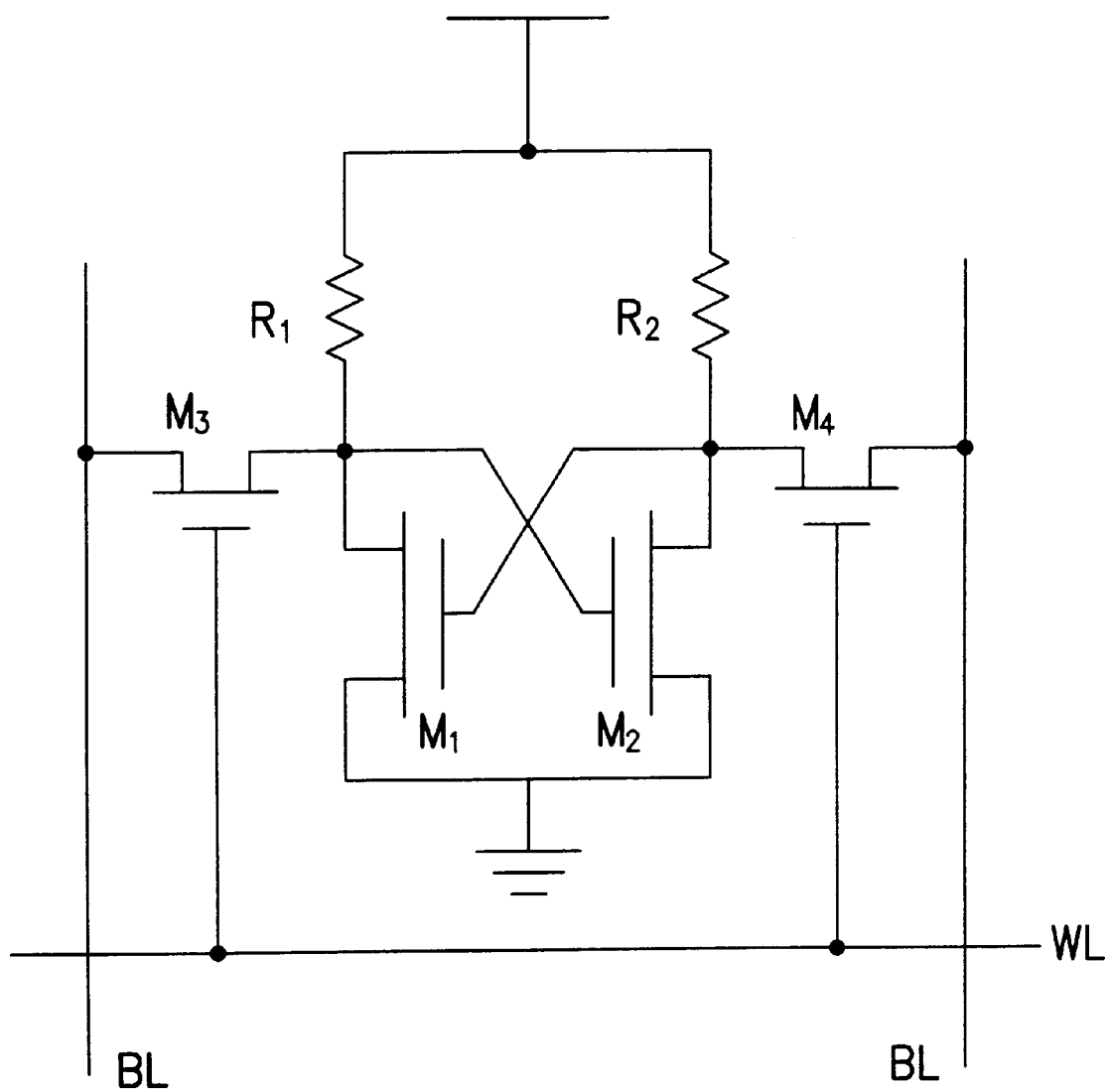
FIG. 1 is a circuit layout diagram of a conventional four-transistor static random access memory (4T SRAM)
Figure 2:
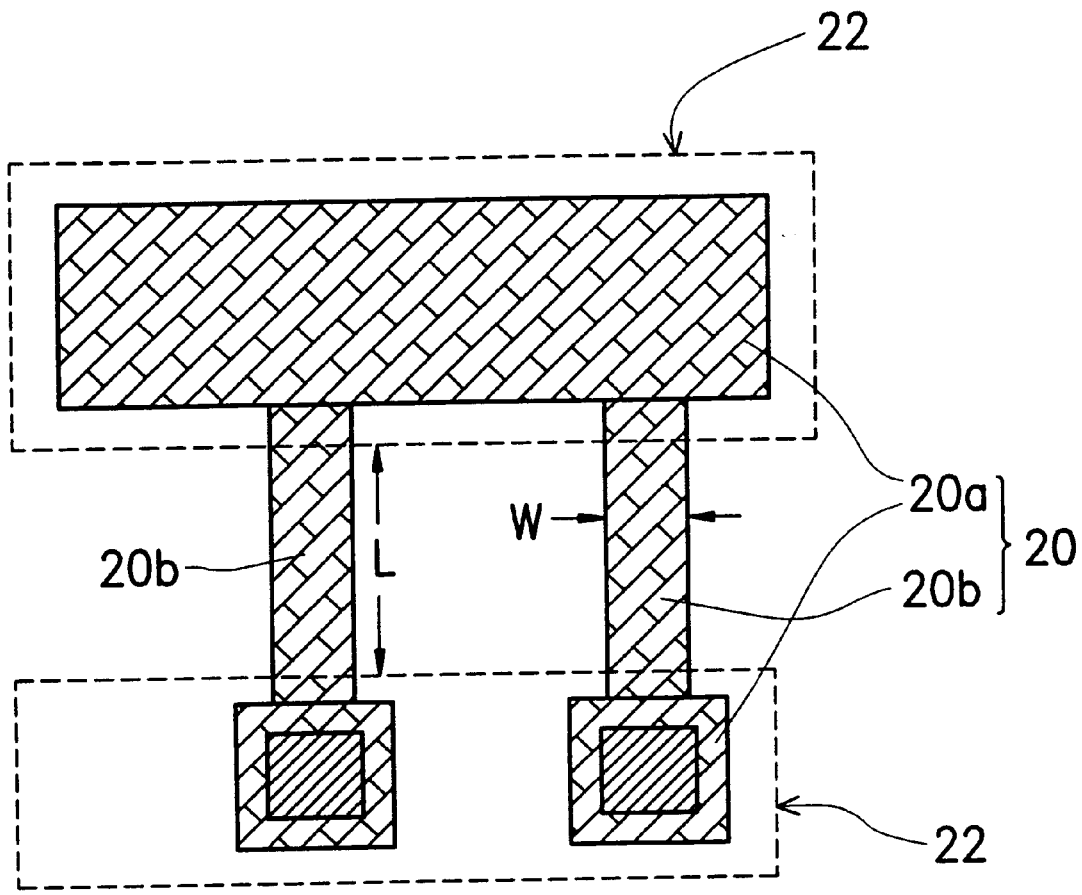
FIG. 2 is a top view of a conventional polysilicon line structure.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are cross-sectional views showing the progression of manufacturing steps in the fabrication of a polysilicon load in static random access memory according to one preferred embodiment of this invention.

Figure 3A:
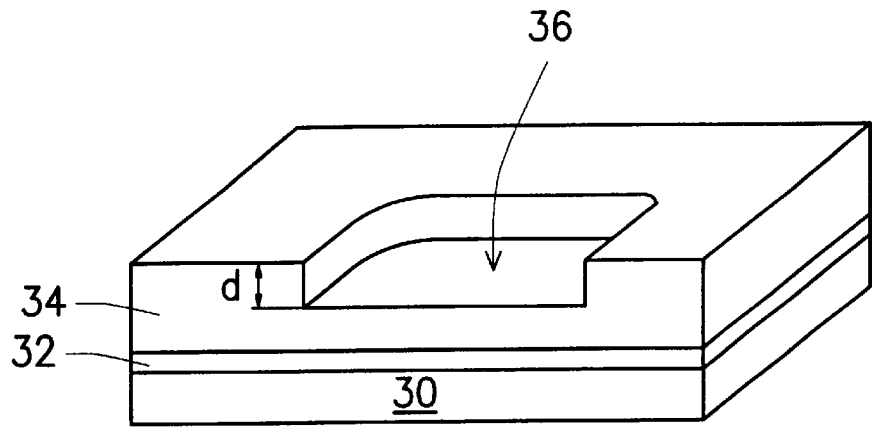
FIGS. 3A through 3E are cross-sectional views showing the progression of manufacturing steps in the fabrication of a polysilicon load in static random access memory according to one preferred embodiment of this invention.

First, as shown in FIG. 3A, a semiconductor substrate 30 having a device layer 32 already formed thereon is provided. The device layer includes various transistor devices or insulating structures between devices. Next, an insulating layer 34 having a thickness between 2000 Å to 5000 Å is formed over the device layer 32, and then a shallow trench 36 is etched out from the insulating layer 34 forming a step structure. The step has a depth of d and is preferably smaller than the thickness of the insulating layer 34. The desired load line is laid along the edge of the trench 36 in a subsequent operation.

Figure 3B:
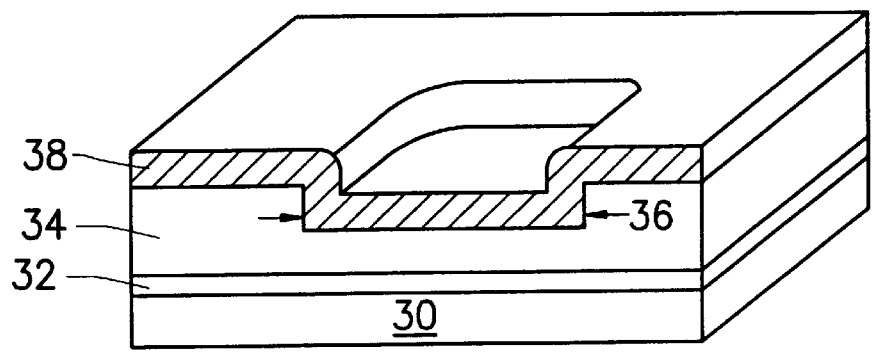

Next, as shown in FIG. 3B, a polysilicon layer 38 is formed over the insulating layer 34 including the step structure of the trench as well. Subsequently, a first global ion implantation is performed implanting impurities into the polysilicon layer 38 and forming a lightly doped region.

Figure 3C:
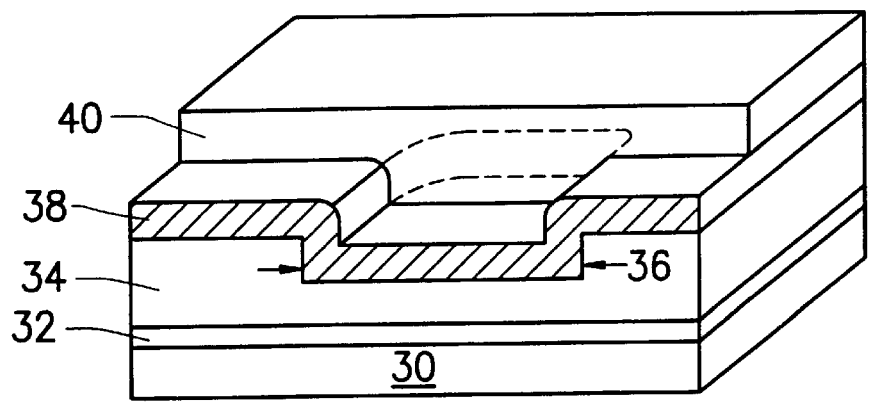

Next, as shown in FIG. 3C, a first photoresist layer 40 is formed over the polysilicon layer 38, and then a connector pattern is defined on the photoresist layer 40 using a microlithographic process.

Figure 3D:
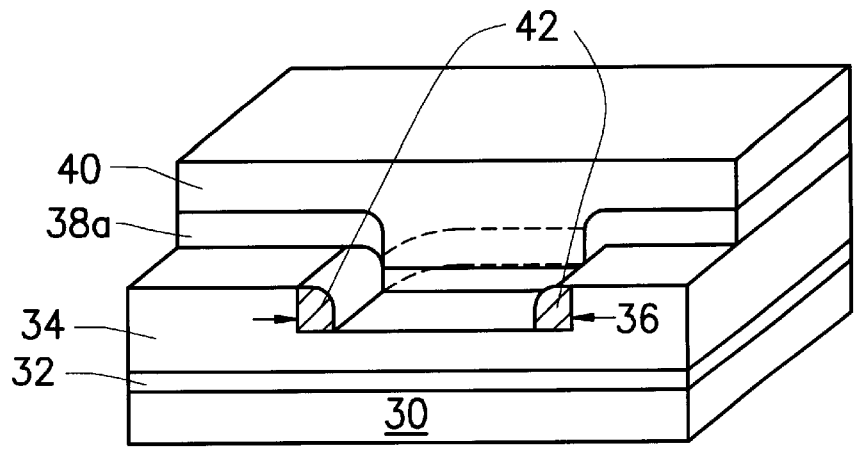

In the subsequent step, as shown in FIG. 3D, the polysilicon layer 38 is etched anisotropically to form a polysilicon spacer structure 42 on the sidewall of the trench using the first photoresist layer 40 as a mask. The polysilicon spacer structure 42 serves as a load.

Figure 3E:
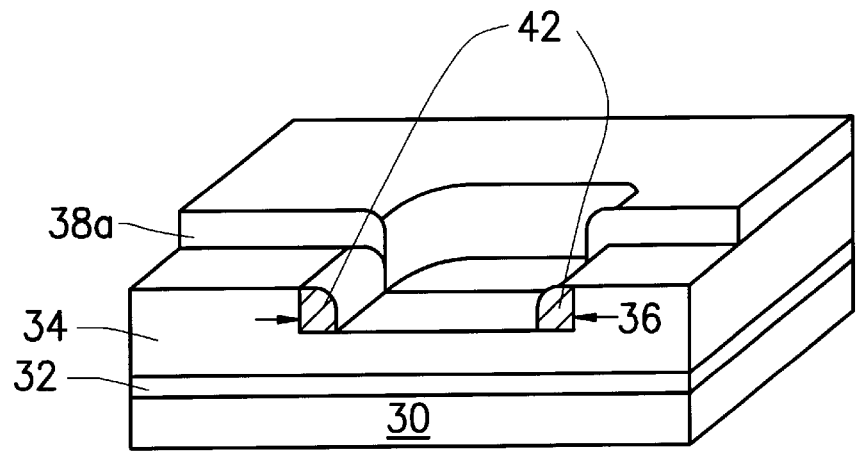

Thereafter, as shown in FIG. 3E, the first photoresist layer 40 is removed to expose the residual polysilicon layer 38a. The residual polysilicon layer 38a is the connector, and the connector has a thickness of about 500 Å to 1500 Å. A second photoresist layer is then formed over the polysilicon layer 38, the insulating layer 34 and the polysilicon spacer structure 42. Thereafter, a pattern is formed on the second photoresist layer using a microlithographic process such that the connector layer 38a is exposed. A second ion implantation is performed to adjust the resistance of the connector layer 38a. The ionic concentration level used in the second implantation is preferably higher than the ionic concentration level in the first implantation. Therefore, the connector layer 38a is a heavily doped region. Subsequently, the second photoresist layer is removed exposing the polysilicon spacer structure 42 and the polysilicon connector structure 38a. Finally, microlithographic and etching processes are again used to remove the unwanted portions of the polysilicon spacer, thus completing the fabrication of a polysilicon load in the static random access memory of this invention.

Figure 4:
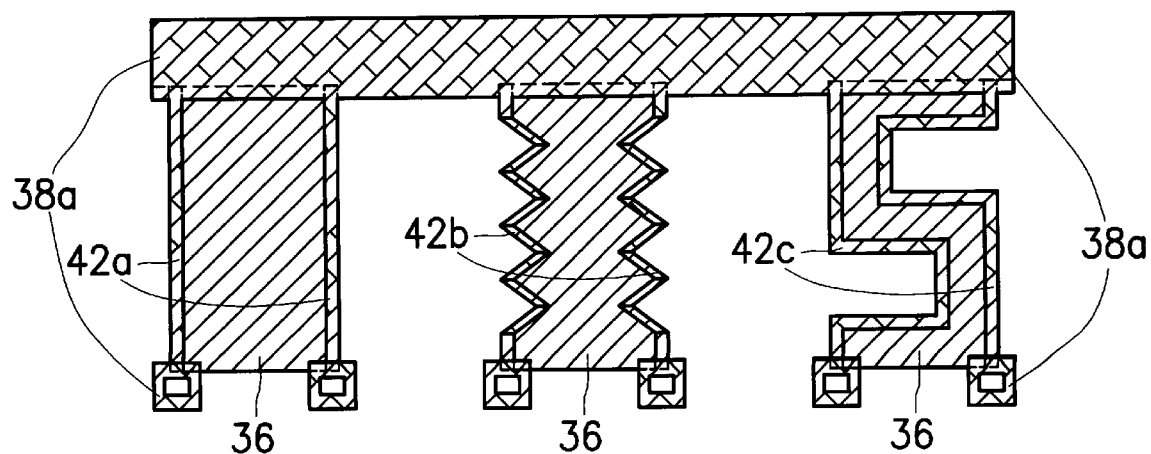
FIG. 4 is a top view showing various shapes of the polysilicon loads in static random access memory according to one preferred embodiment of the invention.

FIG. 4 is a top view showing various shapes of polysilicon load in static random access memory according to one preferred embodiment of the invention. As shown in FIG. 4, polysilicon regions 38a are connector structures connected by spacers 42a. The spacers 42a function as loads. In addition to the linear structure as shown for spacer 42a, other shapes may also be employed as long as the total length of a polysilicon load line is increased, and hence increasing its resistance. For example, a sawtooth-shaped structure 42b and a winding extension structure 42c can both be implemented.

As a summary, the SRAM polysilicon load structure and manufacturing method of this invention has the following characteristics:

(1) The polysilicon load structure of this invention has a high resistance. Therefore, the invention solves the problem of impurity out-diffusion from connectors to the loads in a conventional method that results in a lowering of load resistance. This offers some benefits to the development of future generation of miniaturized SRAM cells.

(2) The polysilicon load of this invention has a spacer structure, and its cross-sectional area can be easily adjusted, for example, by adjusting the depth d of the trench 36, or by changing the thickness of poly-silicon layer 38. Therefore, through reducing the cross-sectional area, load resistance can be increased.

(3) The load structure of this invention can be fabricated into all kinds of planar shapes, so long as the total length of the polysilicon load is increased. For example, beside a linear shape, others such as a sawtooth shape or a winding extension can also be implemented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A polysilicon load structure for static random access memory comprising:

a semiconductor substrate having a device layer formed thereon;

an insulating layer formed above the device layer;

a trench having side walls and a back wall formed within the insulating layer creating a step structure;

a connector layer formed over the insulating layer and portions of the trench to form a back wall portion of the trench; and a spacer forming a portion of the sidewall of the trench for connecting with the connector layer forming the back wall portion of the trench.

2. The structure of claim 1, wherein the insulating layer has a thickness of about 2000 Å to 5000 Å.

3. The structure of claim 1, wherein the connector layer has a thickness of about 500 Å to 1500 Å.

4. The structure of claim 1, wherein the trench preferably has a depth smaller than the thickness of the connector layer.

5. The structure of claim 1, wherein the connector layer is a polysilicon layer.

6. The structure of claim 1, wherein the spacer is a polysilicon layer.

7. The structure of claim 1, wherein the level of concentration of ions in the connector layers is preferably higher than the level of concentration in the spacer.

8. The structure of claim 1, wherein the spacer has a linear structure when viewed from the top.

9. The structure of claim 1, wherein the spacer has a sawtooth structure when viewed from the top.

10. The structure of claim 1, wherein the spacer has a winding extension structure when viewed from the top.

11. A polysilicon load structure for static random access memory, comprising:

a semiconductor substrate having a device layer formed thereon;

an insulating layer formed above the device layer;

a trench formed within the insulating layer creating a step structure;

a connector layer formed over the insulating layer and portions of the trench; and a spacer running along the sidewall of the trench for connecting with the connector layer, wherein resistivity of the load is increased by increasing a total length of a polysilicon load line.

* * * * *